(12) United States Patent
Choi et al.

(10) Patent No.: US 9,812,664 B2
(45) Date of Patent: Nov. 7, 2017

(54) TRANSFORMABLE DEVICE AND METHOD OF MANUFACTURING THE SAME

(71) Applicant: LG DISPLAY CO., LTD., Seoul (KR)

(72) Inventors: Seulgi Choi, Incheon (KR); Suseok Choi, Seongnam-si (KR); Yongsu Ham, Seoul (KR); Taeheon Kim, Seoul (KR); Yongwoo Lee, Goyang-si (KR); Myungjin Lim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/962,569

(22) Filed: Dec. 8, 2015

(65) Prior Publication Data

US 2016/0164023 A1   Jun. 9, 2016

(30) Foreign Application Priority Data

Dec. 9, 2014 (KR) .................. 10-2014-0175855
Jun. 15, 2015 (KR) .................. 10-2015-0084577

(51) Int. Cl.
*G06F 1/16* (2006.01)
*H01L 51/52* (2006.01)
(Continued)

(52) U.S. Cl.
CPC ........ *H01L 51/5225* (2013.01); *G06F 1/1652* (2013.01); *G06F 3/0412* (2013.01); *H01L 27/323* (2013.01); *H01L 41/047* (2013.01); *H01L 41/29* (2013.01); *H01L 51/5209* (2013.01); *H01L 51/56* (2013.01); *G06F 2203/04102* (2013.01); *G06F 2203/04103* (2013.01); *G09G 2380/02* (2013.01);
(Continued)

(58) Field of Classification Search
CPC ..... G06F 1/1652; H01L 41/29; H01L 41/047; H01L 51/5225; H01L 51/5209; H01L 51/56
USPC .............. 361/679.21–679.3, 679.55, 679.56; 359/263
See application file for complete search history.

(56) References Cited

U.S. PATENT DOCUMENTS 5,410,210 A    4/1995 Sato et al.
2008/0291521 A1 * 11/2008 Kim ................. G02B 26/02
                                                          359/263
(Continued)

FOREIGN PATENT DOCUMENTS

JP    05335642 A    12/1993
JP    2009059856 A   3/2009
(Continued)

OTHER PUBLICATIONS

Office Action of Japanese Patent Office in Appl'n No. 2015-239874, dated Aug. 30, 2016.

*Primary Examiner* — Anthony Haughton
(74) *Attorney, Agent, or Firm* — Dentons US LLP

(57) ABSTRACT

A transformable device is provided. The transformable device includes an electro-active layer. A first electrode is disposed at a lower portion inside the electro-active layer. A second electrode is disposed at an upper portion inside the electro-active layer. In the transformable device according to an embodiment of the present disclosure, performance of the electrodes is suppressed from decreasing in spite of repeated operating and a life of the transformable device can be increased as compared with a case of forming electrodes outside an electro-active layer.

15 Claims, 12 Drawing Sheets

(51) Int. Cl.
   *G06F 3/041*    (2006.01)
   *H01L 51/56*    (2006.01)
   *H01L 27/32*    (2006.01)
   *H01L 41/047*   (2006.01)
   *H01L 41/29*    (2013.01)
   *H01L 41/09*    (2006.01)
   *H01L 41/193*   (2006.01)

(52) U.S. Cl.
   CPC ........ *H01L 41/0926* (2013.01); *H01L 41/193* (2013.01); *H01L 2251/5338* (2013.01)

(56) References Cited

U.S. PATENT DOCUMENTS

| | | | |
|---|---|---|---|
| 2011/0149410 A1* | 6/2011 | Blum | G02B 3/14 |
| | | | 359/666 |
| 2012/0139393 A1* | 6/2012 | Choi | H01L 41/0474 |
| | | | 310/366 |
| 2013/0135230 A1 | 5/2013 | Wang et al. | |
| 2014/0118678 A1 | 5/2014 | Yeo | |
| 2014/0175463 A1* | 6/2014 | Nam | H01L 51/0097 |
| | | | 257/88 |

FOREIGN PATENT DOCUMENTS

| TW | M426082 U1 | 4/2012 |
|---|---|---|
| WO | 2006/123317 A2 | 11/2006 |
| WO | 2007/029275 A1 | 3/2007 |

* cited by examiner

TRANSFORMABLE DEVICE AND METHOD OF MANUFACTURING THE SAME

CROSS-REFERENCE TO RELATED APPLICATIONS

This application claims the priority of Korean Patent Application Nos. 2015-0084577 filed on Jun. 15, 2015 and 2014-0175855 filed on Dec. 9, 2014, in the Korean Intellectual Property Office, the disclosures of which are incorporated herein by reference for all purposes as if fully set forth herein.

BACKGROUND

Field of the Invention

The present disclosure relates to a transformable device and a method of manufacturing the transformable device. More, particularly, the present disclosure relates to a transformable device including electrodes therein, and a method of manufacturing the transformable device.

Description of the Related Art

An electro-active polymer (EAP) is a polymer which is transformable by electrical stimulation, and means a polymer which can be repeatedly expanded, contracted, and bent by electrical stimulation. Among various kinds of electro-active polymers, a ferroelectric polymer and a dielectric elastomer are mainly used. For example, the ferroelectric polymer includes PVDF (Poly VinyliDene Fluoride) and P(VDF)-TrFE (Poly(VinyliDene Fluoride)-trifluoroethylene), and the dielectric elastomer may be based on silicon, urethane, acryl, or the like.

The ferroelectric polymer has advantages of satisfactory flexibility and satisfactory permittivity, but has a significant problem in optical properties such as light transmissivity. Thus, it is difficult to use the ferroelectric polymer on the whole face of a display device. Meanwhile, the dielectric elastomer has satisfactory transmissivity, but a driving voltage thereof is high. Thus, there is a problem that it is difficult to use, as it is, the dielectric elastomer in a display device with a relatively low driving voltage such as a mobile device.

However, the dielectric elastomer of the electro-active polymers generally has flexibility and elasticity by which a shape thereof is variously transformable. Accordingly, fields in which dielectric elastomers can be utilized has been recently studied with a flexible display device which has been actively developed. For convenience of description, hereinafter, it is assumed that the dielectric elastomer is used as the electro-active polymer.

When an electric field is applied to an electro-active layer through electrodes disposed on both of an upper face and a lower face of the electro-active layer consisting of electro-active polymers, polarization occurs inside the electro-active layer. Positive charges and negative charges are accumulated on the electrodes disposed at an upper portion and a lower portion of the electro-active layer due to such polarization, respectively, and Maxwell Stress is applied to the electro-active layer by electrostatic attractive force (coulombic force) generated among the accumulated charges. A formula representing a magnitude of Maxwell Stress is as follows.

$$\text{Maxwell Stress}(P) = \varepsilon_r \varepsilon_o E^2 = \varepsilon_r \varepsilon_o \left(\frac{V}{t}\right)^2 \quad \text{[Math 1]}$$

Herein, Maxwell Stress means force of an electro-active layer to be contracted in a thickness direction and to be expanded in a length direction by electrostatic attractive force of charges. Due to a property of an electro-active layer transformed by Maxwell Stress, the electro-active layer is in the limelight as a new material constituting an electro-active layer of a transformable device.

Referring to Math 1, the magnitude P of Maxwell Stress is proportional to magnitudes of permittivity $\varepsilon_r$, electric field E, and voltage V of the electro-active layer. When the magnitude of Maxwell Stress gets larger, the electro-active layer has more displacement or is further transformed. Accordingly, in order to increase the displacement or the degree of transformation of the transformable device, the magnitude of Maxwell Stress has to be increased. Thus, in order to increase Maxwell Stress and lower the driving voltage of the transformable device, a study to raise permittivity of the electro-active layer or to raise an effective electric field is being conducted.

By flexibility and elasticity of the electro-active layer and Maxwell Stress, a method of disposing and forming electrodes in a transformable device rises as an important matter. An electrode formed by sputtering that is a general electrode forming method may be damaged by transformation at the time of operating a transformable device including an electro-active layer consisting of electro-active polymers, and performance of the transformable device is decreased in accordance with repeated operating of the transformable device. An electro-active polymer layer may be inserted between support substrates on which electrodes are formed by the other method. However, since the support substrates have unsatisfactory flexibility as compared with the electro-active layer, the displacement of the electro-active layer may be restricted by the support substrates. Therefore, as an electrode applied to a transformable device including an electro-active layer consisting of electro-active polymers, a soft electrode suitable for transformation is used.

As such a soft electrode, an electrode manufactured by mixing an elastic body with carbon conductive grease, carbon black, or carbon nanotube (CNT) was used. Such an electrode may be formed by a printing process, and has problem that a sheet resistance property is not satisfactory and a process is not easy.

Thus, a transformable device and a method of manufacturing the transformable device are necessary, of which performance is not decreased in spite of repeated operating, displacement of an electro-active layer can be maximally secured by Maxwell Stress, and a manufacturing process is easy.

In order to solve the problem of low performance and shortened life of the electrodes of the transformable device as described above, the inventors of the present disclosure have invented a new-structure transformable device and a method of manufacturing the same with electrodes formed inside an electro-active layer.

An object of the present disclosure is to provide a transformable device and a method of manufacturing the same being able to form electrodes inside an electro-active layer by a simple process.

Further, another object of the present disclosure is to provide a transformable device and a method of manufacturing the same capable of keeping performance of an electrode in spite of repeated operating and increasing a life in accordance with forming an electrode inside the electro-active layer.

Further, still another object of the present disclosure is to provide a display device which does not require a separate adhesive layer used to adhere an electrode outside a transformable device and a separate shielding layer in accordance with forming an electrode inside the transformable device and which is thereby thin.

Objects of the present disclosure are not limited to the objects described above, and other objects which are not mentioned above can be clearly understood by a person skilled in the art from the following description.

SUMMARY OF THE INVENTION

In order to solve the problems described above, a transformable device according to an embodiment of the present disclosure is provided. The transformable device includes an electro-active layer. The first electrode is disposed inside the electro-active layer. The second electrode is disposed inside the electro-active layer, and is disposed on the first electrode a distance from the first electrode. In the transformable device according to an embodiment of the present disclosure, performance of the electrodes is suppressed from decreasing in spite of repeated operating, and a life of the transformable device can be increased as compared with a case of forming electrodes outside an electro-active layer.

According to another aspect of the present invention, the electro-active layer is formed to surround all of the first electrode and the second electrode.

According to another aspect of the present invention, at least one of the first electrode and the second electrode is formed by precipitation of a conductive material. In this case the first and second electrodes can be embedded into the material of the electro-active layer, including natural precipitation, in which conductive material sediments under the influence of gravity within the material of the electro-active layer which is still at least partially liquid, and chemical precipitation by means of an additional precipitant that reacts chemically with the conductive material. According to another aspect of the present disclosure, the electro-active layer includes an electro-active polymer.

According to an exemplary embodiment of the present invention, the electro-active layer includes an elastomer, in particular a dielectric elastomer.

According to still another aspect of the present disclosure, the electro-active layer further includes impurities, the impurities including at least one of a conductive material, a precipitant, and a compound of the conductive material and the precipitant, and a hardener.

According to still another aspect of the present disclosure, a concentration of the impurities in the electro-active layer gets higher as getting closer to the first electrode and the second electrode.

According to still another aspect of the present disclosure, the electro-active layer is disposed to surround the first electrode and the second electrode.

According to still another aspect of the present disclosure, the first electrode and the second electrode are formed within a range along the thickness direction of the electro-active layer in which the concentration of the impurities in the electro-active layer is higher than a specific concentration.

According to still another aspect of the present disclosure, a thickness of the electro-active layer is 50 μm to 400 μm. According to one exemplary embodiment, the thickness of the electro-active layer is 100 μm to 300 μm. The thickness should be selected in consideration of power consumption and driving voltage necessary to operate the transformable device. If the thickness is excessive, a high driving voltage is required to generate Maxwell stress necessary to normally operate the transformable device, and the power consumption is increased. However, if the thickness is too small, sufficient voltage necessary to normally operate the transformable device cannot be applied.

According to still another aspect of the present disclosure, at least one of a thickness between a lower face of the first electrode and a lower face of the electro-active layer and a thickness between an upper face of the second electrode and an upper face of the electro-active layer is 0.1 μm to 10 μm.

According another exemplary embodiment of the present invention, at least one of the thickness between the lower face of the first electrode and the lower face of the electro-active layer and the thickness between the upper face of the second electrode and the upper face of the electro-active layer is proportional to the thickness of the electro-active layer.

In order to solve the problem described above, a display device according to another embodiment of the present disclosure is provided. The display device according to the present invention includes a display panel and a transformable device as described above. The transformable device is disposed under the display panel. The transformable device comprises an electro-active layer and electrodes that are inserted into the electro-active layer. As the transformable device is transformed, the display device is also transformed to various forms, and the display device can provide outputs which are transformed to various forms.

According to another aspect of the present disclosure, the display panel has a flexible substrate.

According to still another aspect of the present disclosure, the display device further includes a lower cover that is disposed under the transformable device, and an upper cover that is disposed on the transformable device, wherein the lower cover and the upper cover consists of a material having flexibility.

The display device of the above kind may be one of the following: a smartphone; a watch; an electronic newspaper; a curtain.

According to still another aspect of the present disclosure, the display device of the above kind is one of the following: a smartphone; a watch; an electronic newspaper; a curtain.

The present disclosure is further related to a method for manufacturing a transformable device of the above kind comprising the steps of: injecting conductive material to a first electro-active layer material and a second electro-active layer material; precipitating the conductive material to form a first electro-active layer and a second electro-active layer with first and second electrodes disposed inside the first and second electro-active layers, respectively, and hardening the first electro-active layer and the second electro-active layer; and joining the first electro-active layer and the second electro-active layer to each other.

In this method, the first and second electrodes are formed individually in the respective first and second electro-active layers. By controlling the precipitation of the conductive material and the hardening of the material of the first and second electro-active layers, a variation of concentration of impurities, including, for example, the conductive material, the precipitant, and the hardener can be varied within the respective electro-active layer, as well as the forming of the first and second electrodes. When the individual first and second electro-active layers are hardened, they can be joined to each other without the need of any adhesive layer between them.

According to one embodiment, the first and second electro-active layer are joined to each other by heat.

According to another embodiment of the present invention, pressure is applied to the first and second electro-active layers which are heated, thereby completely joining them. An interface between the first and second electro-active layer disappears in this process, and on electro-active layer is formed.

According to one embodiment of the present invention, the precipitation of the conductive material is a natural precipitation, in which the conductive material is precipitated in the electro-active layer material with liquidity by gravity. This natural precipitation is a sedimentation in which the precipitant is deposited.

According to another embodiment of the present invention, the precipitation is a chemical precipitation in which the conductive material is precipitated in the electro-active layer material with liquidity by a chemical reaction with a precipitant.

According to different embodiments of the present invention, the hardening of the first and second electro-active layer materials can be performed by natural hardening, in which that the electro-active layer material is hardened at a normal temperature, by chemical hardening, meaning that the electro-active layer material is hardened in a chemical reaction, hardening by heat, i.e. at a temperature higher than a normal temperature, or hardening by light, for example, by ultraviolet rays (UV).

According to another embodiment of the method according to the present invention, the method comprises a process of injecting a precipitant and/or a hardener to the first electro-active layer material and the second electro-active layer material.

According to still another preferred embodiment of the present invention, the process of injecting a precipitant to the first electro-active layer material and the second electro-active layer material and the process of injecting a hardener to the first electro-active layer material and the second electro-active layer material are simultaneously performed.

According to another preferred embodiment of the present invention the speed of hardening of the first electro-active layer material and the second electro-active layer material is controlled by setting a ratio of the respective electro-active layer material and the hardener. In this embodiment, the concentration of impurities, including the conductive material, the precipitant and the hardener in the respective electro-active layer can be controlled. With a variation of concentration of the impurities, the permittivity of the respective electro-active layer can be varied.

Details of other embodiments are included in the detailed description and the drawings.

According to the present disclosure, it is possible to provide the transformable device in which the electrodes for applying voltage to the electro-active layer can be easily formed inside the electro-active layer, in which performance of the electrodes can be kept for a long time in spite of repeated operating.

In addition, it is possible to provide the transformable device in which the electrodes can be formed inside the electro-active layer within a short processing time without an expensive electrode forming equipment for forming the electrodes.

Moreover, since a separate adhesive layer and shielding layer are not necessary when the electrodes are inserted into the transformable device to provide the transformable device with the electrodes, it is possible to provide the display device which has a small thickness and is advantageous in being thin.

Advantages according to the present disclosure are not limited to the description exemplified above, and more various advantages are included in the specification.

DETAILED DESCRIPTION OF THE ILLUSTRATED EMBODIMENT

Figure 1:
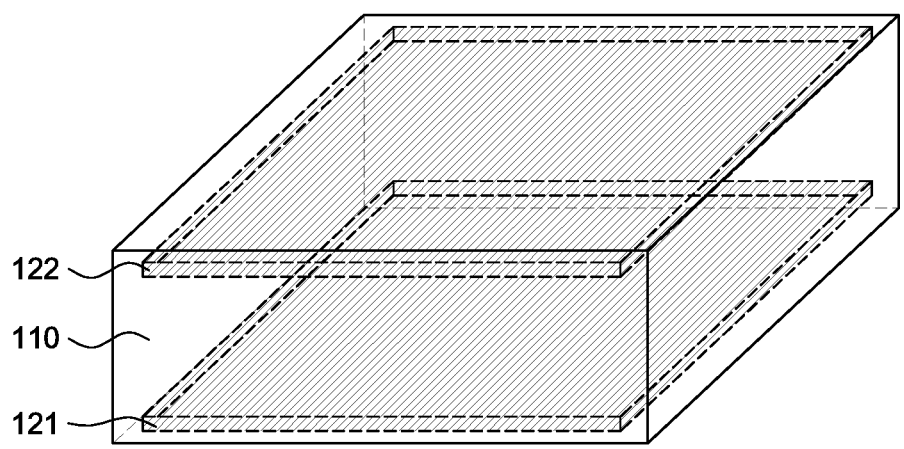
FIG. 1 is a schematic perspective diagram illustrating a transformable device according to an embodiment of the present disclosure.

Advantages and features of the present disclosure and method of achieving them will be clarified with reference to the embodiments described below in detail with the accompanying drawings. However, the present disclosure is not limited to the embodiments described below, and will be embodied in various forms. The embodiments make the present disclosure complete, and is provided to allow a person skilled in the art to completely know the scope of the present disclosure, but is defined only by the scope of Claims.

Shapes, sizes, ratios, angles, the number of components, and the like disclosed in the drawings for describing the embodiments of the present disclosure are exemplary, and the present disclosure is not limited to the illustration. In addition, in the description of the present disclosure, when it is determined that specific description about the related known technique may unnecessarily blur the gist of the present disclosure, detailed description thereof is omitted. When 'include', 'have', 'comprise', and the like mentioned in the specification are used, other parts may be added unless 'only' is used. A constituent element is expressed by a singular form, it includes a plurality form unless there is specific description.

In analyzing constituent elements, they include an error range even when there is no separate description.

In description of positional relations, when a positional relation between two parts is described with, for example, 'on', 'at an upper portion', 'under', 'at a lower portion', 'near', and the like, one or more other parts may be positioned between two parts unless 'right' or 'directly' is used.

Description that a device or a layer is on another device or layer includes all cases where another layer or another device is interposed right on another device or in between.

Although the first, the second, or the like are used to describe various constituent elements, the constituent elements are not limited by these terms. These terms are used merely to distinguish one constituent element from the other constituent element. Accordingly, the first constituent element mentioned hereinafter may be the second constituent element within the technical spirit of the present disclosure.

Throughout the specification, the same reference numerals and signs denote the same constituent elements.

A size and a thickness of each configuration illustrated in the drawings are shown for convenience of description, but the present disclosure is not necessarily limited to the size and the thickness of the illustrated configuration.

Features of various embodiments of the present disclosure can be partially or entirely coupled or combined with each other, and can technically variously interlocked or operated as can be sufficiently understood by a person skilled in the art, and the embodiments may be embodied independently from each other, and may be embodied together in cooperation with each other.

Hereinafter, various embodiments of the present disclosure will be described in detail with reference to the accompanying drawings.

FIG. 1 is a schematic perspective view illustrating a transformable device according to an embodiment of the present disclosure. Referring to FIG. 1, a transformable device 100 includes an electro-active layer 110, a first electrode 121, and a second electrode 122.

Referring to FIG. 1, the electro-active layer 110 includes electro-active polymers. Specifically, the electro-active layer 110 consists of dielectric elastomers. For example, the electro-active layer 110 may consists of dielectric elastomer based on silicon, urethane, acryl, or the like.

The first electrode 121 is an electrode that is disposed at a lower portion of the transformable device 100. Specifically, the first electrode 121 is disposed at the lower portion of the electro-active layer 110 inside the electro-active layer 110. For example, the first electrode 121 may be disposed separately from a lower face of the electro-active layer 110 inside the electro-active layer 110 as illustrated in FIG. 1, and the first electrode 121 may be disposed to come in contact with the lower face of the electro-active layer 110 inside the electro-active layer 110 although not illustrated.

The second electrode 122 is an electrode that is disposed at an upper portion of the transformable device 100. The second electrode 122 is disposed at the upper portion of the electro-active layer 110 inside the electro-active layer 110 in a vertical distance from the first electrode 121. For example, the second electrode 122 may be disposed separately from an upper face of the electro-active layer 110 inside the electro-active layer 110 as illustrated in FIG. 1, and the second electrode 122 may be disposed to come in contact with the upper face of the electro-active layer 110 inside the electro-active layer 110 although not illustrated.

The first electrode 121 and the second electrode 122 may be made of the same material. Specifically, the first electrode 121 and the second electrode 122 include a conductive material. For example, the first electrode 121 and the second electrode 122 may be made of various conductive materials such as metal powder, carbon nanotube (CNT), Ag-Nanowire (Ag-NW), or conductive polymer. In some embodiments, the first electrode 121 and the second electrode 122 may further include impurities other than conductive materials. In this case, the impurities may be a precipitant or a compound of a conductive material and a precipitant.

Although not illustrated in FIG. 1, the electro-active layer 110 may further include impurities other than the electro-active polymer. Specifically, the impurities may be at least one of the same materials as the conductive material constituting the first electrode 121 and the second electrode 122, the precipitant, and the compound of the precipitant and the conductive material.

When there are impurities in the electro-active layer 110, a concentration of the impurities in the electro-active layer 110 increases closer to the first electrode 121 and the second electrode 122. In other words, the concentration of the impurities is highest around the first electrode 121 and the second electrode 122, and is lowest at the center of the electro-active layer 110 that is an intermediate portion between the first electrode 121 and the second electrode 122.

The concentration of the impurities in the electro-active layer 110 has an influence on a magnitude of Maxwell Stress applied to the electro-active layer 110. Maxwell Stress is proportional to permittivity of the electro-active layer 110, and the permittivity may be raised by the impurities in the electro-active layer 110. Specifically, when there are impurities in the electro-active layer 110, the permittivity of the electro-active layer 110 is raised, and thus, Maxwell Stress applied to the electro-active layer 110 may be increased.

The first electrode 121 and the second electrode 122 are soft electrodes. In other words, the first electrode 121 and the second electrode 122 may have flexibility to transform a shape in the electro-active layer 110 made of elastomers having flexibility. Accordingly, the first electrode 121 and the second electrode 122 are inserted into the electro-active layer 110. Thus, cracks do not occur and performance of the electrodes is not lowered even when the shape of the electro-active layer 110 is transformed.

The electro-active layer 110 is transformed by an electric field generated by charges supplied to the first electrode 121 and the second electrode 122, and the transformable device 100 is thereby transformed. Specifically, a direction and a shape of transformation of the transformable device 100 may be varied according to polarity of the charges supplied to the first electrode 121 and the second electrode 122. Hereinafter, a procedure of transforming the electro-active layer 110 by the first electrode 121 and the second electrode 122 will be described in detail.

The first electrode 121 supplies charges to the lower portion of the electro-active layer 110. The second electrode 122 supplies charges to the upper portion of the electro-active layer 110. Accordingly, an electric field is formed between the first electrode 121 and the second electrode 122. In this case, electrical properties of the charges supplied to the first electrode 121 and the second electrode 122 may be opposite to each other. In other words, when positive charges are supplied to the first electrode 121, negative charges are supplied to the second electrode 122, and when negative charges are supplied to the first electrode 121, positive charges are supplied to the second electrode 122. In this case, when the electrical property of the charges supplied to the first electrode 121 and the electrical property of the charges supplied to the second electrode 122 are changed to be opposite to each other, the direction of the electrical field is also changed. In other words, voltage applied to the electro-active layer 110 between the first electrode 121 and the second electrode 122 may be alternating-current (AC) voltage, and an electric field based on the alternating-current voltage is formed between the first electrode 121 and the second electrode 122. In some embodiments, positive charges or negative charges are supplied to any one of the first electrode 121 and the second electrode 122, and the other may be grounded.

Accordingly, the electric field formed between the first electrode 121 and the second electrode 122 causes polarization in the electro-active layer 110 between the first electrode 121 and the second electrode 122, and the electro-active layer 110 subjected to Maxwell Stress by the electrostatic attractive force based on the polarization is transformed.

When the alternating-current voltage is applied between the first electrode 121 and the second electrode 122, Maxwell Stress is generated in the electro-active layer 110 by the electric field between the first electrode 121 and the second electrode 122. A degree of transformation of the electro-active layer 110 and the transformable device 100 is varied according to amplitude of such alternating-current voltage applied between the first electrode 121 and the second electrode 122. Specifically, when the amplitude of the alternating-current voltage applied between the first electrode 121 and the second electrode 122 is increased, the magnitude of Maxwell Stress is increased in proportional to the square of the amplitude of the alternating-current voltage. Accordingly, when the amplitude of the alternating-current voltage applied between the first electrode 121 and the second electrode 122 is increased, the magnitude of Maxwell Stress is increased, and the shapes of the electro-active layer 110 and the transformable device 100 are greatly transformed.

In addition, a transformation speed of the electro-active layer 110 and the transformable device 100 is changed according to a frequency of the alternating-current voltage applied between the first electrode 121 and the second electrode 122. Specifically, when the frequency of the alternating-current voltage applied between the first electrode 121 and the second electrode 122 is raised, polarity of the alternating-current voltage applied between the first electrode 121 and the second electrode 122 is rapidly changed. Accordingly, the direction of Maxwell Stress applied to the electro-active 110 and the transformable device 100 is rapidly changed, and the direction of transformation of the electro-active 110 and the transformable device 100 is also rapidly changed.

In the transformable device 100 according to an embodiment of the present disclosure, the first electrode 121 and the second electrode 122 capable of keeping performance for a long period in spite of repeated operating are disposed inside the electro-active layer 110. Specifically, the first electrode 121 is inserted into the lower portion in the electro-active layer 110, the second electrode 122 is inserted into the upper portion in the electro-active layer 110, and thus the electric field is formed in the electro-active layer 110 by the charges supplied from the first electrode 121 and the second electrode 122. However, when a first electrode and a second electrode are formed in a manner of coating or printing soft electrodes on an outer face of an electro-active layer, the soft electrodes are broken or damaged due to repeated operating of a transformable device. Accordingly, the soft electrodes do not serve as electrodes, and the transformable device cannot also operate. On the contrary, in the transformable device 100 according to an embodiment of the present disclosure, the first electrode 121 and the second electrode 122 are inserted into the electro-active layer 110, and are made of a material suitable for transformation, and thus a damage of the first electrode 121 and the second electrode 122 can be minimized in spite of repeated operating of the transformable device 100.

In addition, when the electro-active layer 110 of the transformable device 100 according to an embodiment of the present disclosure includes impurities, the magnitude of Maxwell Stress is increased by the impurities in the electro-active layer 110. Specifically, there may be impurities other than electro-active polymers in the electro-active layer 110 between the first electrode 121 and the second electrode 122, the electro-active polymers including the impurities have higher permittivity than that of dielectric elastomers which do not include the impurities. Accordingly, since the electro-active layer 110 including the impurities has higher permittivity than that of the electro-active layer which does not include the impurities, the magnitude of Maxwell Stress proportional to permittivity is also increased.

Hereinafter, it will be described in detail that a driving voltage of the transformable device 100 is lowered in accordance with disposing the first electrode and the second electrode in the electro-active layer 110 with reference to FIG. 2A to FIG. 2C together.

Figure 2A:
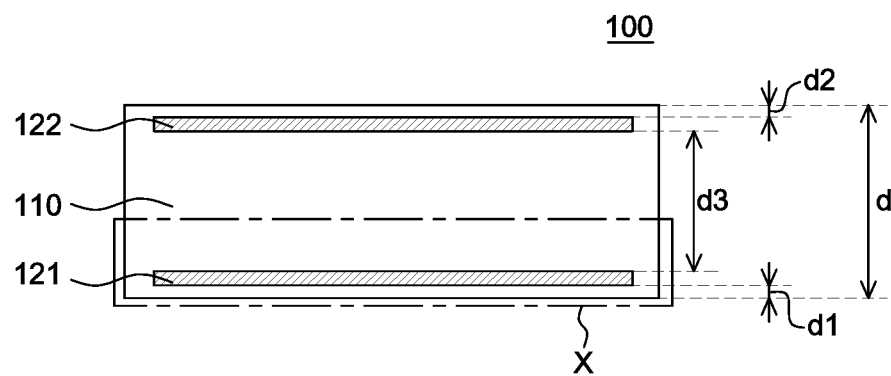
FIG. 2A to FIG. 2C are schematic cross-sectional views of a transformable device according to an embodiment of the present disclosure and a graph illustrating a concentration of a conductive material with respect to a height of an electro-active layer.
Figure 2B:
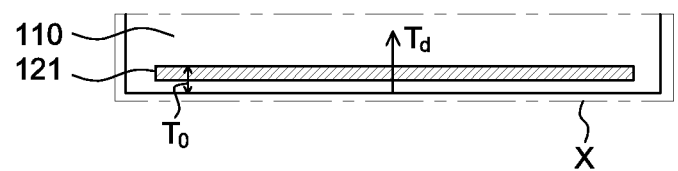
Figure 2C:
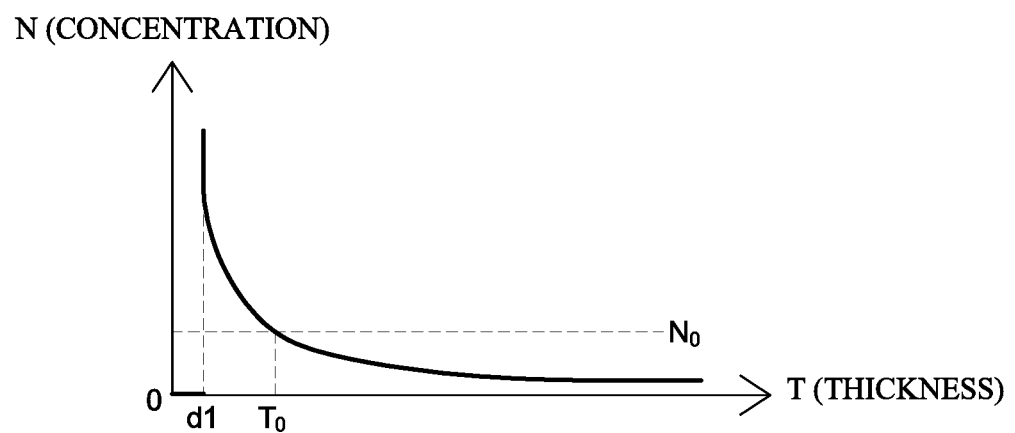

FIG. 2A to FIG. 2C are schematic cross-sectional views of a transformable device according to an embodiment of the present disclosure and a graph illustrating a concentration of a conductive material with respect to a height of an electro-active layer in the cross-sectional view. Specifically, FIG. 2A is a schematic cross-sectional view of the transformable device according to an embodiment of the present disclosure, FIG. 2B is a cross-sectional view obtained by enlarging a part (X) of the transformable device in FIG. 2A, and FIG. 2C is a graph about a concentration of a conductive material according to a height in the cross section of the transformable device illustrated in FIG. 2B. Since FIG. 2A and FIG. 2B are cross-sectional views of the transformable device 100 illustrated in FIG. 1, the same description is not repeated.

Referring to FIG. 2A, the first electrode 121 is disposed away from the lower face of the electro-active layer 110, and the second electrode 122 is disposed away from the upper face of the electro-active layer 110. Accordingly, the electro-active layer 110 is formed to surround all of the first electrode 121 and the second electrode 122. In other words, the first electrode 121 and the second electrode 122 are inserted into the electro-active layer 110. Specifically, the conductive material injected to the electro-active layer material is precipitated to be away from the lower face of the electro-active layer, thereby forming the electrodes. For example, the conductive material is injected to the first electro-active layer material, and the injected conductive material is precipitated to be away from the lower face of the first electro-active layer, thereby forming the first electrode 121, and the conductive material is injected to the second electro-active layer material, and the injected conductive material is precipitated to be away from the lower face of the second electro-active layer, thereby forming the second electrode 122. In this case, the first electrode 121 and the second electrode 122 may be formed to have an arbitrary thickness by precipitating the conductive material. Accordingly, after the first electrode 121 and the second electrode 122 are formed, the transformable device 100 may be formed by joining the first electro-active layer material and the second electro-active layer material such that the second electrode 122 is disposed above the first electrode 121 as illustrated in FIG. 2A. In other words, as illustrated in FIG. 2A, in the transformable device 100, the first electrode 121 may be formed away from the lower face of the electro-active layer 110, and the second electrode 122 may be formed away from the upper face of the electro-active layer 110. A specific method of manufacturing the transformable device including the first electrode 121 and the second electrode 122 will be described later with reference to FIG. 3 and FIG. 4A to FIG. 4D.

As described above, when the electro-active layer 110 is formed under the first electrode 121 and on the second electrode 122 inside the electro-active layer 110, a thickness d1 of the electro-active layer 110 formed under the first electrode 121 and a thickness d2 of the electro-active layer 110 formed on the second electrode 122 are smaller than a thickness d3 of the electro-active layer 110 formed between the first electrode 121 and the second electrode 122. In some embodiments, the thickness d1 of the electro-active layer 110 formed under the first electrode 121 and the thickness d2 of the electro-active layer 110 formed on the second electrode 122 may be different from each other.

Herein, the thickness d of the electro-active layer 110 may be freely selected by a person skilled in the art considering power consumption and driving voltage necessary to operate the transformable device 100 and considering whether to normally operate as the transformable device 100. Preferably, the thickness d of the electro-active layer 110 may be 50 μm to 400 μm. More preferably, the thickness d of the electro-active layer 110 may be 100 μm to 300 μm. Herein, when the thickness d of the electro-active layer 110 is smaller than 50 μm, sufficient voltage necessary to normally operate the transformable device 100 cannot be applied. Accordingly, the transformable device 100 cannot be normally operated. In addition, when the thickness d of the electro-active layer 110 is larger than 400 μm, a high driving voltage is required to generate Maxwell Stress necessary to normally operate the transformable device, and power consumption may be excessively increased thereby.

The part of the electro-active layer 110 formed under the first electrode 121 and the part of the electro-active layer 110 formed on the second electrode 122 may serve as shielding layers. In other word, the part of the electro-active layer 110 formed under the first electrode 121 and the part of the electro-active layer 110 formed on the second electrode 122 can shield the first electrode 121 and the second electrode 122 from contacting with an external conductive material. Accordingly, the first electrode 121 and the second electrode 122 may be connected to an external power supply line through contact holes of the part of the electro-active layer 110 formed under the first electrode 121 and the part of the electro-active layer 110 formed on the second electrode 122.

The thickness d1 of the electro-active layer 110 formed under the first electrode 121 and the thickness d2 of the electro-active layer 110 formed on the second electrode 122 may be determined suitably to perform the shielding layer function. For example, at least one of the thickness d1 of the electro-active layer 110 formed under the first electrode 121 and the thickness d2 of the electro-active layer 110 formed on the second electrode 122 may be 0.1 μm to 10 μm. Herein, when the thickness d1 of the electro-active layer 110 formed under the first electrode 121 and the thickness d2 of the electro-active layer 110 formed on the second electrode 122 are smaller than 0.1 μm, the functions as the shielding layers of the electro-active layer 110 formed under the first electrode 121 and the electro-active layer 110 formed on the second electrode 122 may significantly decreased. When the thickness d1 and the thickness d2 are larger than 10 μm, it may be difficult to connect the first electrode 121 and the second electrode 122 to the external power supply line through the contact holes. In this case, the electro-active layer 110 having the relation in thickness described above can be formed by adjusting a concentration and a specific gravity of the conductive material injected to the electro-active layer 110 and adjusting whether to add a precipitant.

In some embodiments, when the thickness d of the electro-active layer 110 is 300 μm and when the thickness d1 of the electro-active layer 110 formed under the first electrode 121 and the thickness d2 of the electro-active layer 110 formed on the second electrode 122 are several μm to 10 μm, the thickness d3 of the electro-active layer 110 formed between the first electrode 121 and the second electrode 122 is formed with about 280 μm to 290 μm.

The thickness d3 of the electro-active layer 110 between the first electrode 121 and the second electrode 122 has an influence on the magnitude of Maxwell Stress applied to the electro-active layer 110. Maxwell Stress is proportional to a magnitude of an effective electric field, and the magnitude of the effective electric field between the first electrode 121 and the second electrode 122 is increased as the distance between the first electrode 121 and the second electrode 122 gets smaller. According to the decrease of the thickness d3 of the electro-active layer 110 formed between the first electrode 121 and the second electrode 122 by decreasing the distance between the first electrode 121 and the second electrode 122, the magnitude of the effective electric field applied to the electro-active layer 110 between the first electrode 121 and the second electrode 122 is increased. Accordingly, in order to increase the magnitude of the effective electric field while minimizing the amplitude of the alternating-current voltage applied between the first electrode 121 and the second electrode 122, the first electrode 121 and the second electrode 122 are disposed in the electro-active layer 110 to make the distance between the first electrode 121 and the second electrode 122 narrow. As compared with a case where the first electrode 121 and the second electrode 122 are disposed on the upper face and the lower face of the electro-active layer 110, respectively, that is, a case where the first electrode 121 and the second electrode 122 are away by the thickness d of the electro-active layer 110, Maxwell Stress applied to the electro-active layer 110 may be increased, and the transformable device 100 can be operated only by the alternating-current voltage with small amplitude.

Referring to FIG. 2B and FIG. 2C, the concentration of the conductive material is gradually decreased in a direction from the lower face of the first electrode 121 to the center of the electro-active layer 110. Specifically, it is determined that a direction from the lower face of the electro-active layer 110 toward the upper face of the electro-active layer 110 is a thickness direction Td of the electro-active layer 110, the concentration N of the conductive material is gradually decreased as getting close to the center of the electro-active layer 110 along the thickness direction Td of the electro-active layer 110 from the first electrode 121. In addition, there may be no conductive material in the electro-active layer 110 between the lower face of the electro-active layer 110 and the lower face of the first electrode 121. In other words, in order for the conductive material to substantially serve as an electrode, the conductive material is precipitated to be away from the lower face of the electro-active layer 110 by an arbitrary thickness, and is precipitated corresponding to the thickness of the first electrode 121, thereby configuring the first electrode 121.

When the concentration of the conductive material is equal to or lower than a specific concentration N0 (percolation threshold) while the concentration N of the conductive material is decreased along the thickness direction Td of the electro-active layer 110, the conductive material cannot serves an electrode. In other words, as proceeding in the thickness direction Td of the electro-active layer 110 from the upper face of the first electrode 121 formed by precipitation, the concentration N of the conductive material is decreased to be a the concentration N0 or lower capable of serving as an electrode. Therefore, the conductive material existing between the upper face of the first electrode 121 and the center of the electro-active layer 110 does not substantially constitute the electrode. Similarly, as illustrated in FIG. 2A, as getting close to the center of the electro-active layer 110 from the lower face of the second electrode 122 formed by precipitation, the concentration N of the conductive material is decreased to be a the concentration N0 or lower capable of serving as an electrode. Therefore, the conductive material existing between the lower face of the second electrode 122 and the center of the electro-active layer 110 does not substantially constitute the electrode.

Accordingly, although there is the conductive material in the electro-active layer 110 between the first electrode 121 and the second electrode 122, the conductive material existing in the electro-active layer 110 between the first electrode 121 and the second electrode 122 may not serve as an electrode. However, the conductive material existing in the electro-active layer 110 between the first electrode 121 and the second electrode 122 serves as a dopant of increasing Maxwell Stress by increasing permittivity of the electro-active layer 110. Accordingly, Maxwell Stress acting on the electro-active layer 110 is increased and the driving voltage for generating the same Maxwell Stress may be decreased.

In the transformable device 100 according to an embodiment of the present disclosure, the first electrode 121 and the second electrode 122 are disposed in the electro-active layer 110, and the magnitude of Maxwell Stress is increased. Specifically, since the first electrode 121 and the second electrode 122 are disposed in the electro-active layer 110, the distance between the first electrode 121 and the second electrode 122 is decreased as compared with a case where electrodes are disposed outside the electro-active layer 110. Accordingly, the magnitude of the effective electric field between the first electrode 121 and the second electrode 122 is increased, and the magnitude of Maxwell Stress proportional to the magnitude of the effective electric field is also increased.

Figure 3:
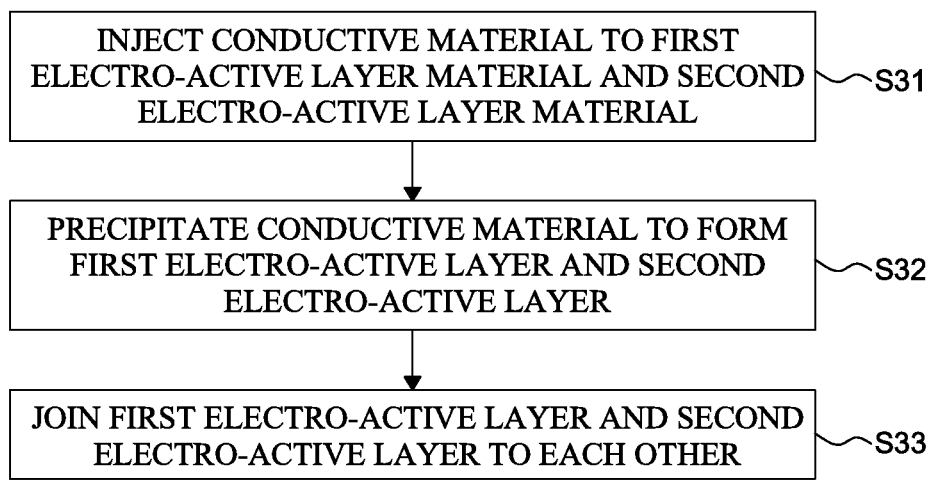
FIG. 3 is a flowchart illustrating a method of manufacturing a transformable device according to an embodiment of the present disclosure.

FIG. 3 is a flowchart illustrating a method of manufacturing a transformable device according to an embodiment of the present disclosure. FIG. 4A to FIG. 4D are perspective views illustrating processes of a method of manufacturing a transformable device according to an embodiment of the present disclosure. FIG. 4A to FIG. 4D are perspective views illustrating processes of a method of manufacturing the transformable device illustrated in FIG. 1, and the constituent elements described with reference to FIG. 1 are not repeatedly described.

First, the conductive material is injected to the first electro-active layer material and the second electro-active layer material (S31).

Figure 4A:
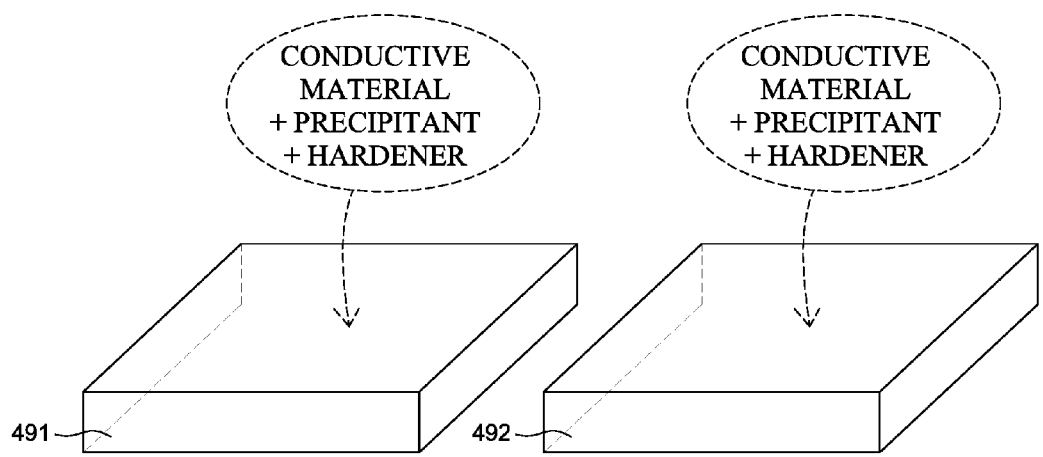
FIG. 4A to FIG. 4D are perspective views illustrating processes of a method of manufacturing a transformable device according to an embodiment of the present disclosure.
Figure 4B:
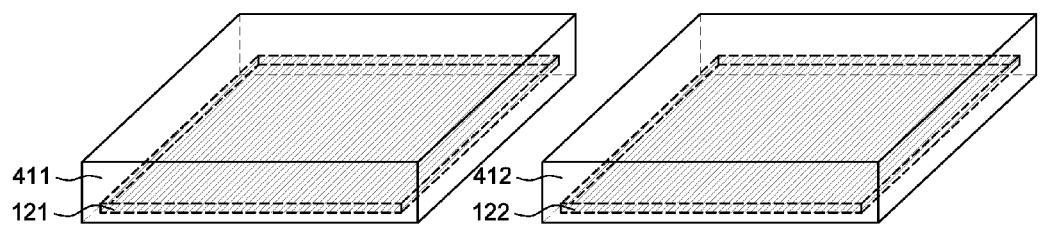

Referring to FIG. 4A, the conductive material is injected to the first electro-active layer material 491 and the second electro-active layer material 492. In this case, the first electro-active layer material 491 and the second electro-active layer material 492 include electro-active polymers, and are in a liquid state or a semi-liquid state. In other words, the first electro-active layer material 491 and the second electro-active layer material 492 are materials with liquidity, and are in a state where a conductive material can be injected. In addition, a precipitant may be further injected to the first electro-active layer material 491 and the second electro-active layer material 492, and a hardener may be further injected to the first electro-active layer material 491 and the second electro-active layer material 492.

Herein, the conductive material includes a material with conductivity independently in the first electro-active layer material 491 and the second electro-active layer material 492. In addition, the conductive material may include a material with conductivity through a chemical reaction with a precipitant. In other words, the conductive material includes both of a material itself with conductivity, and a material itself having no conductivity but having conductivity by reacting with a precipitant. For example, the conductive material may be metal powder, carbon nanotube (CNT), Ag-Nanowire (Ag-NW), or conductive polymer.

The precipitant is a material which chemically reacts with a conductive material to precipitate the conductive material. Accordingly, the precipitant may be converted into a conductive precipitate by causing a precipitation reaction with the conductive material. For example, the precipitant may be a precipitant used in a sewage treatment plant.

Herein, the hardener is a material which hardens the first electro-active layer material 491 and the second electro-active layer material 492 in a liquid state with liquidity or a semi-liquid state into a solid state. A function of the hardener will be described later with reference to FIG. 4B.

Subsequently, the conductive material is precipitated to form the first electro-active layer and the second electro-active layer (S32). Herein, the electrodes are formed while the conductive material is precipitated downward in the electro-active layer and the first electro-active layer material 491 and the second electro-active layer material 492 are hardened. In other words, in the process of forming the electro-active layer, a process of precipitating the conductive material downward in the electro-active layer and a process of hardening the electro-active layer may be simultaneously performed. However, as the electro-active layer is hardened at a high speed, a ratio of the precipitated conductive material of the injected conductive material in the electro-active layer may be lowered. Accordingly, when the hardening speed of the electro-active layer is high, an impurity concentration in the electro-active layer may be increased.

The conductive material is precipitated in the first electro-active layer material 491 to form the first electrode 121. Specifically, the conductive material may be naturally precipitated in the first electro-active layer material 491 by sedimentation. In this case, the natural precipitation means that the conductive material is sedimented in the first electro-active layer material 491 with liquidity by gravity. For example, when the first electro-active layer material 491 including the conductive material is left for 24 hours or more, the conductive material is naturally precipitated by gravity.

In addition, the conductive material may be chemically precipitated in the first electro-active layer material 491 by a precipitant. In this case, the chemical precipitation means that the conductive material is precipitated in the first electro-active layer material 491 with liquidity by a chemical reaction with the precipitant. For example, the conductive material may be changed to a new chemical precipitate with conductivity through chemical coupling with a precipitant, and the new chemical precipitate is disposed under the first electro-active layer material 491.

While the first electro-active material 491 is hardened, liquidity thereof may be decreased. Specifically, the first electro-active layer 411 may be naturally hardened. In this case, the natural hardening means that the first electro-active layer material 491 is hardened at a normal temperature.

In addition, the first electro-active layer material 491 may be chemically hardened by a hardener. In this case, the chemical hardening means that the first electro-active layer material 491 is hardened by a chemical reaction, and a hardening speed may be varied according a hardener. Specifically, a speed of hardening the first electro-active layer material 491 may be varied according to a ratio of the first electro-active layer material 491 and the hardener. For example, when the ratio of the first electro-active layer material 491 and the hardener is increased from 10:1 to 10:3, the hardening speed is raised.

In addition, the first electro-active layer material 491 may be hardened by heat. Specifically, the first electro-active layer material 491 may be hardened at a temperature higher than a normal temperature, for example, 90° C. Accordingly, when the first electro-active layer material 491 is hardened by heat, the first electro-active layer material 491 may be hardened at a speed higher than that of the natural hardening.

In addition, the first electro-active layer material 491 may be hardened by light. Specifically, the first electro-active layer material 491 may be hardened by, for example, ultraviolet rays (UV). Accordingly, when the first electro-active layer material 491 is hardened by light, the first electro-active layer material 491 may be hardened at a speed higher than that of the natural hardening.

In such heat hardening and light hardening, a hardener different from that of the chemical hardening may be used, a ratio of the first electro-active layer material 491 and the hardener may be different from that of the chemical hardening.

Accordingly, the liquidity of the first electro-active layer material 491 is rapidly decreased by the natural hardening, the chemical hardening, the heat hardening, and the light hardening, the conductive material is rapidly precipitated by the natural precipitation and the chemical precipitation, and the first electrode 121 is thereby formed in the first electro-active layer 411. In this case, when the hardening speed is raised, the first electro-active layer material 491 is rapidly hardened, and the first electrode 121 is formed in the first electro-active layer 411 before all of the conductive material, the precipitant, and the hardener are precipitated. Accordingly, the concentration of the impurities including the conductive material, the precipitant, and the hardener in the first electro-active layer 411 is increased. As the concentration of the impurities is increased, the permittivity of the first electro-active layer 411 may be also increased slightly. When the first electro-active layer 411 is hardened, the first electro-active layer 411 is in a state capable of being joined to the other electro-active layer.

The second electrode 122 is formed at the lower portion of the second electro-active layer 412 through the same process as the process of forming the first electrode 121 at the lower portion of the first electro-active layer 411. However, the process of forming the second electrode 122 at the lower portion of the second electro-active layer 412 and the process of forming the first electrode 121 at the lower portion of the first electro-active layer 411 may have difference in a specific natural precipitation and a natural hardening time or a configuration and a ratio of a new chemical precipitate, and the like. In other words, the first electrode 121 and the second electrode 122 may be formed in the same process, but detailed process conditions in the process of forming the first electrode 121 and the second electrode 122 may be different.

Subsequently, the first electro-active layer and the second electro-active layer are joined to each other (S33).

Figure 4C:
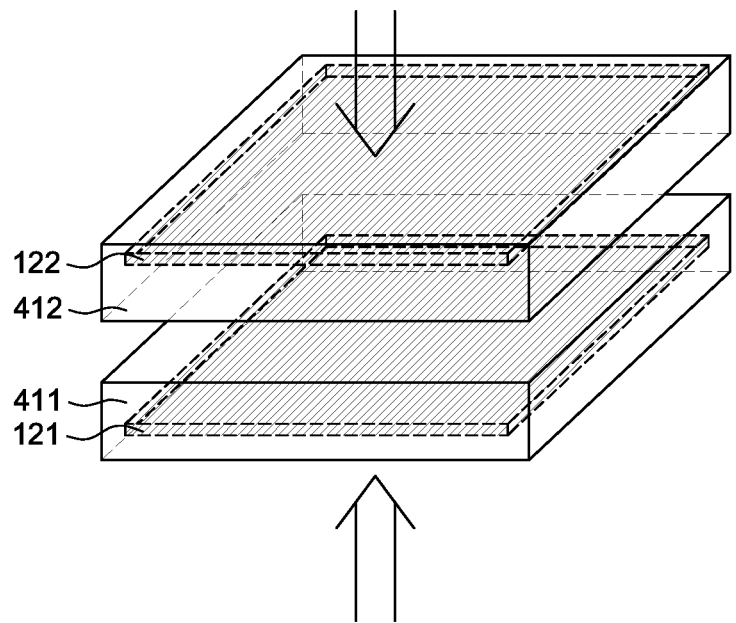
Figure 4D:
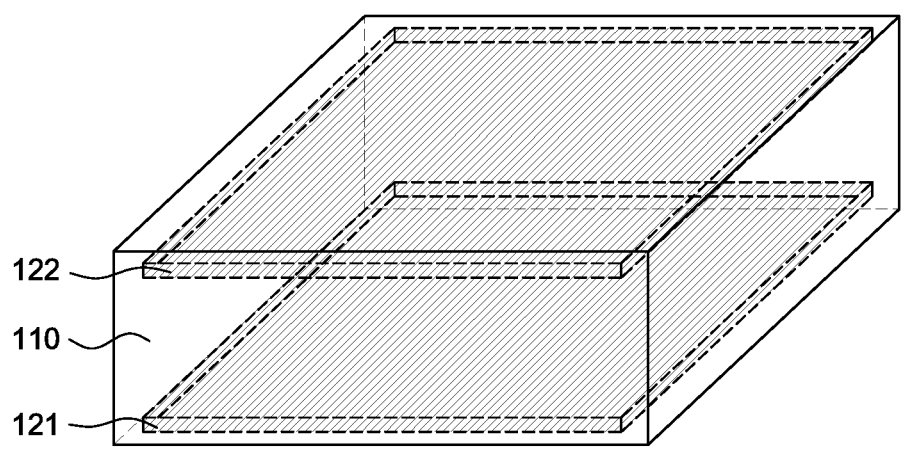

Referring to FIG. 4C, the first electro-active layer 411 and the second electro-active layer 412 are joined to each other. Specifically, the joining process may be performed after the second electro-active layer 412 is turned upside down and is disposed on the first electro-active layer 411 such that the upper face of the second electro-active layer 412 in FIG. 4B comes in contact with the upper face of the first electro-active layer 411. In this case, the first electro-active layer 411 and the second electro-active layer 412 may be joined to each other by heat. Specifically, after the upper face of the first electro-active layer 411 and the upper face of the second electro-active layer 412 are disposed to come in contact with each other, pressure is applied from the lower portion of the first electro-active layer 411 and the upper portion of the second electro-active layer 412, which are heated. For example, pressure of about 40 MPa is applied to the first electro-active layer 411 and the second electro-active layer 412, and the first electro-active layer 411 and the second electro-active layer 412 are heated at 150° C. to 200° C., thereby completely joining them.

Specifically, an interface disappears between the upper face of the first electro-active layer 411 and the upper face of the second electro-active layer 412 by the heat and pressure applied to the first electro-active layer 411 and the second electro-active layer 412, and thus one electro-active layer 110 may be formed. Accordingly, the transformable device 100 is formed in which the first electrode 121 is disposed at the lower portion and the second electrode 122 is disposed at the upper portion in one electro-active layer 110.

Meanwhile, a part of the electro-active layer 110 may be removed to connect the first electrode 121 and the second electrode 122 to an external power source. Specifically, a part of the electro-active layer formed under the first electrode 121 or on the side thereof, or a part of the electro-active layer 110 formed on the second electrode 122 or on the side thereof may be removed. In this case, the part of the electro-active layer 110 may be removed by silicon etchant. A wire may be connected to come in contact with the first electrode 121 or the second electrode 122 through the removed part of the electro-active layer 110, and power is supplied to the transformable device 100 through the wire connected to the first electrode 121 or the second electrode 122.

In the method of manufacturing the transformable device according to an embodiment of the present disclosure, the conductive material is precipitated in the electro-active layer to easily form the electrodes. Specifically, the conductive material is precipitated in the electro-active layer to form the soft electrodes. In other words, an expensive separate equipment such as a sputtering equipment to form the electrodes at the upper portion or the lower portion of the electro-active layer is not necessary, and the electro-active layer including the electrodes therein can be simply and easily formed in bulk only by natural precipitation based on gravity and chemical precipitation based on a precipitant.

In addition, in the method of manufacturing the transformable device according to another embodiment of the present disclosure, the plurality of electro-active layers provided therein with electrodes without any adhesive are heated and pressed to easily form the transformable device 100. Specifically, since the electrodes are disposed in the electro-active layer, the electrodes are not disposed outside the plurality of electro-active layers. Accordingly, an adhesive for adhering between the electro-active layer and the electrode and between the electrodes is not necessary, and the transformable device 100 can be easily formed by applying heat and pressure to the electro-active layer.

Figure 5:
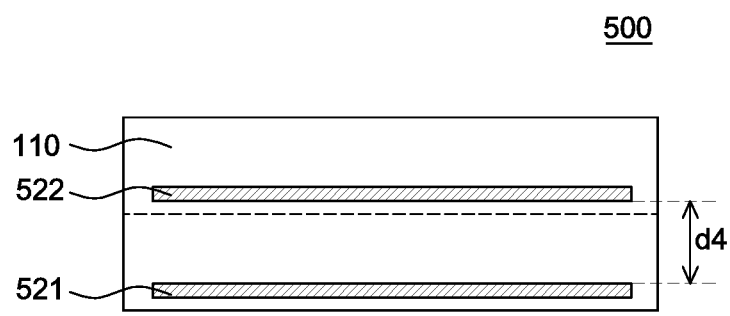
FIG. 5 is a schematic cross-sectional view illustrating a transformable device according to another embodiment of the present disclosure.

FIG. 5 is a schematic cross-sectional view illustrating a transformable device according to another embodiment of the present disclosure. In a transformable device 500 illustrated in FIG. 5, only a position of a second electrode 522 is changed as compared with the transformable device 100 illustrated in FIG. 1 and FIG. 2A, the other configuration is substantially the same, and the overlapped description is not repeated.

Referring to FIG. 5, a first electrode 521 and a second electrode 522 are disposed in the electro-active layer 110. Specifically, the first electrode 521 is disposed at the lower portion of the electro-active layer, and the second electrode 522 is disposed close to the center of the electrode active layer 110. For example, the second electrode 522 may be disposed at a portion higher than the center of the electro-active layer 110. In other words, the lower face of the second electro-active layer 412 is disposed to come in contact with the upper face of the first electro-active layer 411 without turning upside down the second electro-active layer 412 such that the upper face of the second electro-active layer 412 in FIG. 4B comes in contact with the upper face of the first electro-active layer 421. Accordingly, a distance d4 between the first electrode 521 and the second electrode 522 is smaller than the distance d3 between the first electrode 121 and the second electrode 122 in the transformable device 100 illustrated in FIG. 2A. Accordingly, the distance between the first electrode 521 and the second electrode 522 is decreased as compared with the case where the second electrode 522 is disposed at the upper portion of the electro-active layer 110. As the distance between the first electrode 521 and the second electrode 522 is decreased, the magnitude of Maxwell Stress applied to the electro-active layer 110 is increased.

In the transformable device 500 according to another embodiment of the present disclosure, the magnitude of Maxwell Stress is increased between the first electrode 521 and the second electrode 522. Specifically, the first electrode 521 is disposed at the lower portion of the electro-active layer 110 in the electro-active layer 110, and the second electrode 522 is disposed at a portion higher than the intermediate portion that is a half of the thickness d of the transformable device 100 illustrated in FIG. 2A. In this case, the distance d4 between the first electrode 521 and the second electrode 522 is smaller than the distance d3 between the first electrode 121 and the second electrode 122 in the transformable device 100 illustrated in FIG. 2A. Accordingly, the thickness d4 of the electro-active layer formed between the first electrode 521 and the second electrode 522 is decreased, the magnitude of the effective electric field of the electro-active layer formed between the first electrode 521 and the second electrode 522 is increased, and the magnitude of Maxwell Stress may be also increased.

Figure 6:
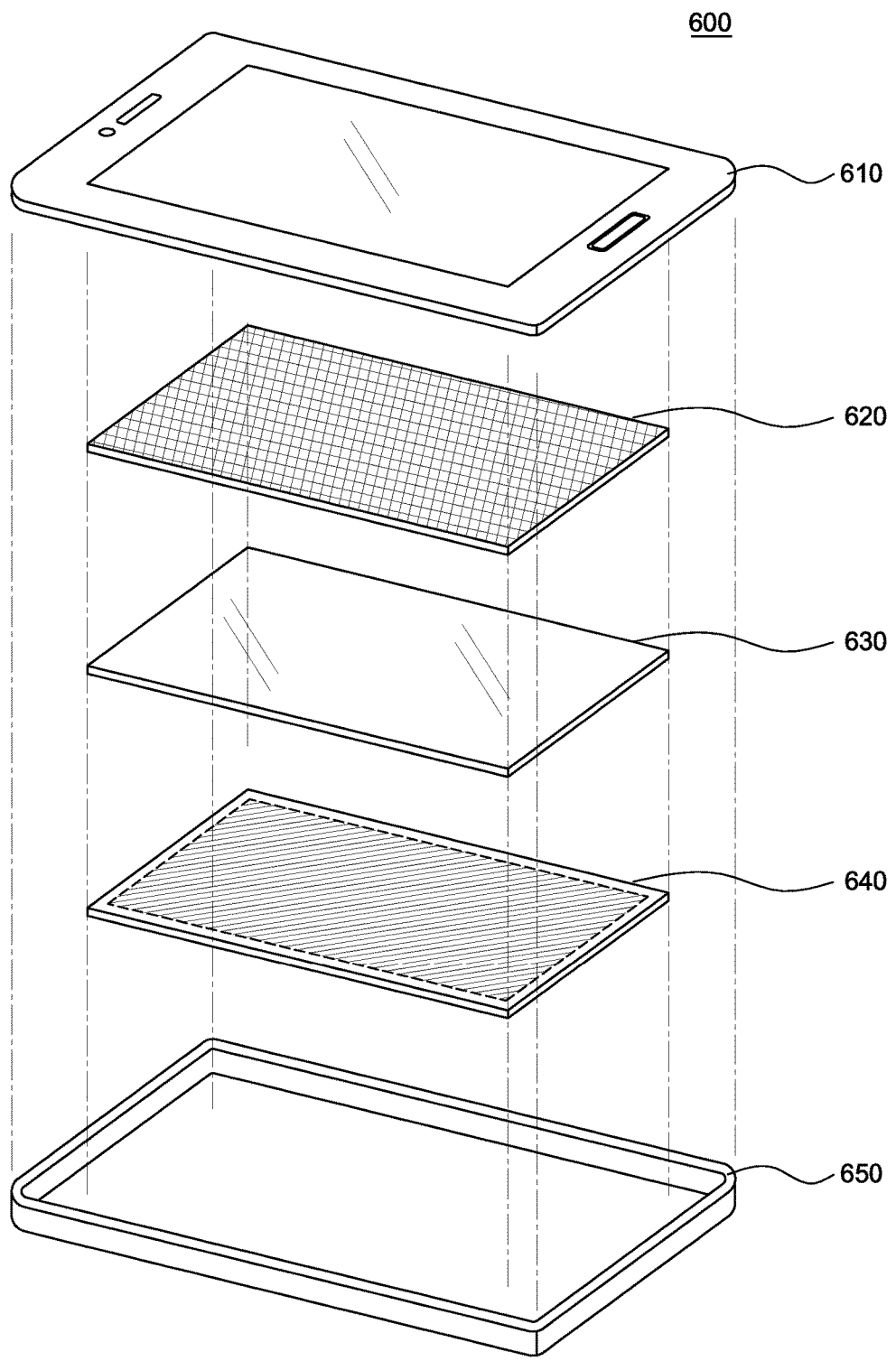
FIG. 6 is an exploded perspective view illustrating a display device including a transformable device according to an embodiment of the present disclosure.

FIG. 6 is a schematic exploded perspective view illustrating a display device including the transformable device according to an embodiment of the present disclosure. Referring to FIG. 6, a display device 600 includes an upper cover 610, a touch panel 620, a display panel 630, a transformable device 640, and a lower cover 650. Terms like "up", "down", "on", "upper", "lower", etc. refer to a usual orientation of a display device 600 in use in which the display panel can be watched from the upper side, i.e. from the side of the upper cover 610, while the lower cover 650 covers the display device from the opposite side. It is noted that this terminology shall not restrict the invention to any orientation of the display device 600 but serves to clarify the arrangement of the different components of the display device 600 with regard to each other.

The upper cover 610 is disposed on the touch panel 620 to cover the upper portions of the touch panel 620, the display panel 630, and the transformable device 640. The upper cover 610 protects the internal configurations in the display device 600 from external impact, foreign materials, and moisture. For example, the upper cover 610 may be made of a material such as plastic which can be formed by heat and has satisfactory formability, but is not limited thereto. In addition, the upper cover 610 may be made of a material which is transformable with the change in shape of the transformable device 640. For example, the upper cover 610 may be made of a material such as plastic with flexibility, but is not limited thereto.

The touch panel 620 is disposed on the transformable device 100. The touch panel 620 means a panel that senses a touch input of a user to a display device 700. For example, an electrostatic capacitance manner, a resistive film manner, an ultrasonic manner, an infrared ray manner, or the like may be used as the touch panel 620, but preferably, the touch panel 620 in the electrostatic capacitance manner may be used as the touch panel 620.

Although not illustrated in FIG. 6, adhesive layers may be used to adhere the display panel 630, the transformable device 640, the touch panel 620, and the upper cover 610 to one another. The adhesive layers may be, for example, OCA (optical clear adhesive) or OCR (optical clear resin), but are not limited thereto.

The display panel 630 means a panel in which a display element for displaying a video in the display device 600 is disposed. The display panel 630 may be, for example, various display panels such as an organic light emitting display panel, a liquid crystal display panel, and an electrophoretic display panel. In this case, the display panel 630 may be an organic light emitting display device. Since the transformable device 640 disposed under the display panel 630 may be transformed with flexibility, the organic light emitting display device may be configured to be also transformed with flexibility. In other words, the organic light emitting display device is an organic light emitting display device with flexibility, and includes a flexible substrate. The flexible organic light emitting display device is transformable in various directions and at various angles by force applied from the outside. Hereinafter, for convenience of description, it is assumed that the display panel 630 is configured by the flexible organic light emitting display device.

The transformable device 640 is disposed under the display panel 630. Specifically, the transformable device 640 is disposed under the display panel 630. The transformable device 640 may be disposed to come in direct contact with the lower face of the display panel 630, and an adhesive layer may be further disposed between the lower face of the display panel 630 and the upper face of the transformable device 640. In this case, the transformable device 640 may be one of the transformable device 100 illustrated in FIG. 1 and FIG. 2A and the transformable device 500 illustrated in FIG. 5.

In addition, the transformable device 640 may be electrically connected to the display panel 630. For example, a FPCB (flexible printed circuit board) disposed in the display panel 630 and the electrodes of the transformable device 640 may be electrically connected to each other by wiring. The lower cover 650 is disposed under the transformable device 640 to cover the lower portions of the touch panel 620, the display panel 630, and the transformable device 640. The lower cover 650 may be made of the same material as that of the upper cover 610. Particularly, the lower cover 650 may be also made of a flexible material to be transformable together with the touch panel 620 and the display panel 630 which are transformable in various shapes by the transformable device 640. For example, the lower cover 650 may be made of a material such as plastic with flexibility, but is not limited thereto.

As voltage is applied to the transformable device 640, the transformable device 640 is transformed. Accordingly, the touch panel 620 and the display panel 630 joined to the transformable device 640 are also transformed according to the transformation of the transformable device 640, and the display device 600 is also transformed.

In the display device 600 according to an embodiment of the present disclosure, the touch panel 620, the display panel 630, and the transformable device 640 are integrated into one, and the display device 600 can be transformed in various shapes by the transformable device 640. Specifically, when voltage is applied to the transformable device 640, the transformable device 640 is transformed. Accordingly, the touch panel 620 and the display panel 630 are also transformed together according to the shape of transformation of the transformable device 640. In other words, the entire of the display device 600 can be transformed, and the deformed shape of the display device 600 based on the transformation of the transformable device 640 will be described below with reference to FIG. 7.

Figure 7:
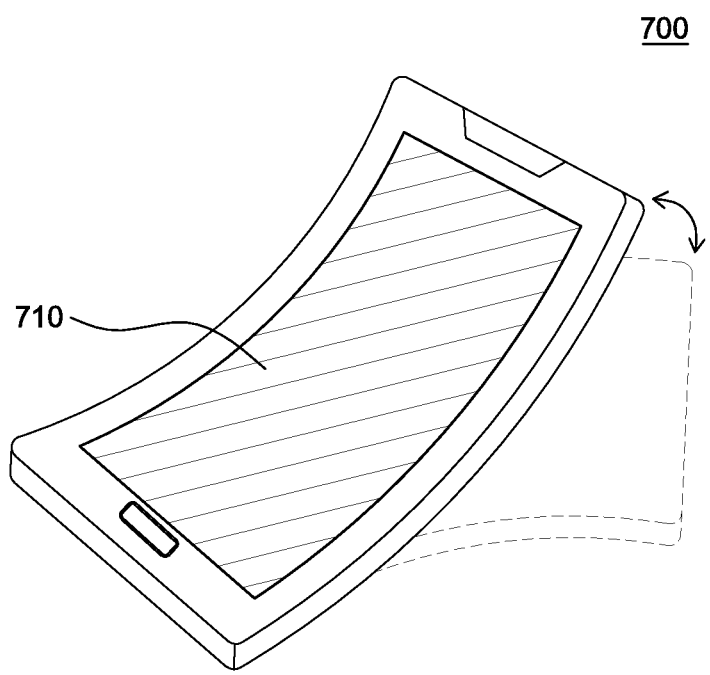
FIG. 7 is an exemplary state diagram illustrating various transformations of a display device including a transformable device according to an embodiment of the present disclosure.

FIG. 7 is an exemplary state diagram illustrating various transformation shapes of the display device including the transformable device according to an embodiment of the present disclosure. In FIG. 7, for convenience of description, it is assumed that the display device 700 is a smartphone.

Referring to FIG. 7, a part of the display device 700 can be bent upward or downward. Specifically, in the display device 700, a transformable device is fixed under a display screen 710, and the entire of the transformable device and the display device 700 is transformed by operating the transformable device. In other words, a part of the display device 700 may be bent upward or downward according to bending of a part of the transformable device upward or downward. Herein, as a part of the transformable device is bent upward or downward at a predetermined period, a part of the display device 700 may be also bent upward or downward. In addition, as a state where a part of the transformable device is bent upward or downward is kept, a state where a part of the display device 700 is bent upward or downward may be kept.

For example, a part of the display device 700 may be bent upward or downward by an output corresponding to a touch input of a user input to the display device 700. In other words, when the display device 700 receives a message or a voice call is incoming to the display device 700, a part of the display device 700 may be bent upward or downward as an output corresponding thereto.

In the display device 700, a bent part, a bending direction, a bending time, a period of change in bending direction, and the like may be variously set through the display device 700. In other words, the change in shape of the display device 700 by the transformable device may be variously set by a user, and is not limited to the exemplary change in shape described above.

In the display device 700 including the transformable device according to an embodiment of the present disclosure, the transformable device is transformed differently according to various inputs. Specifically, the transformed part, the transforming direction, the continuous time of transformation, the period of change in transforming direction, and the like may be set differently for each input applied to the display device 700. Accordingly, the display device 700 is transformed in various shapes by the transformable device, and various kinds of outputs may be provided for a user.

Figure 8:
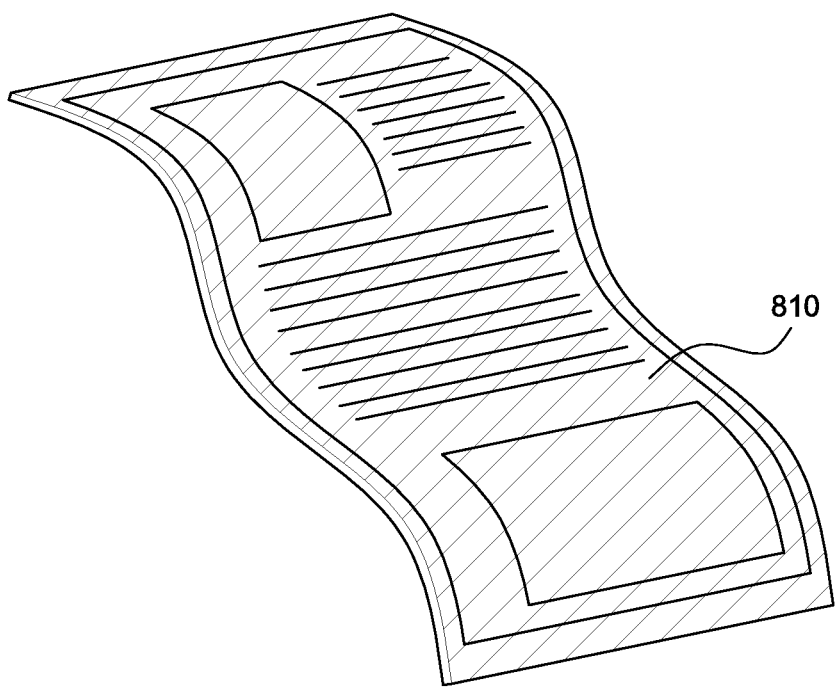
FIG. 8 is an exemplary diagram illustrating an electronic newspaper including a transformable device according to an embodiment of the present disclosure.

FIG. 8 is an exemplary diagram of an electronic newspaper including the transformable device according to an embodiment of the present disclosure. Referring to FIG. 8, an electronic news paper 800 includes a display panel 810 and a transformable device joined to the lower portion of the display panel 810.

In the electronic newspaper 800 including the transformable device according to an embodiment of the present disclosure, a feeling similar to reading an actual newspaper made of paper may be provided by the transformable device. When a signal of turning over a page is input through the display panel 810 of the electronic newspaper 800, the transformable device at a part to which the signal is input may be transformed. Accordingly, a part of the electronic newspaper 800 is temporarily bent while the transformable device is transformed, and a feeling of turning over a page may be provided like a newspaper made of paper.

In addition, when a new article is uploaded and displayed on the electronic newspaper 800 including the transformable device according to an embodiment of the present disclosure, a part of the electronic newspaper 800 is transformed to provide the fact that the article is uploaded. For example, when an article having a new headline is uploaded, the transformable device at the article-uploaded part is transformed to immediately display the fact that the article is uploaded.

Figure 9:
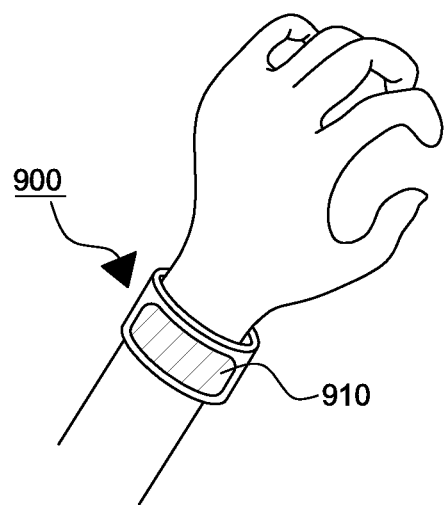
FIG. 9 is an exemplary diagram illustrating a watch including a transformable device according to an embodiment of the present disclosure.

FIG. 9 is an exemplary diagram illustrating a watch including the transformable device according to an embodiment of the present disclosure. Referring to FIG. 9, a watch 900 includes a display panel 910 and a transformable device joined to the lower portion of the display panel 910. For convenience of description, it is assumed that the watch 900 is a smart watch.

In the watch 900 including the transformable device according to an embodiment of the present disclosure, various functions of the watch 900 may be embodied by the transformable device. General time information is displayed through the display panel 910 of the watch 900. In addition, weather, news, and the like may be displayed through the display panel 910 of the watch 900. Moreover, the watch 900 may include a simple calling function, and may determine a heart rate of a user who wears the watch 900. Herein, in order to let a user know every hour on the hour or know a designated alarm time, the transformable device in the watch 900 may be contracted. Accordingly, time information may be provided by tightening user's wrist. In addition, even when new weather information or news is displayed, the transformable device in the watch 900 may be contracted, and when a phone call is received, a protrusion portion may be formed at a part of the display panel 910 of the watch 900, thereby providing the information. In addition, when a heart rate of a user measured through a part of the watch 900 is in a risk level, the transformable device in the watch 900 may be contracted or changed in shape to provide warning to the user.

Figure 10:
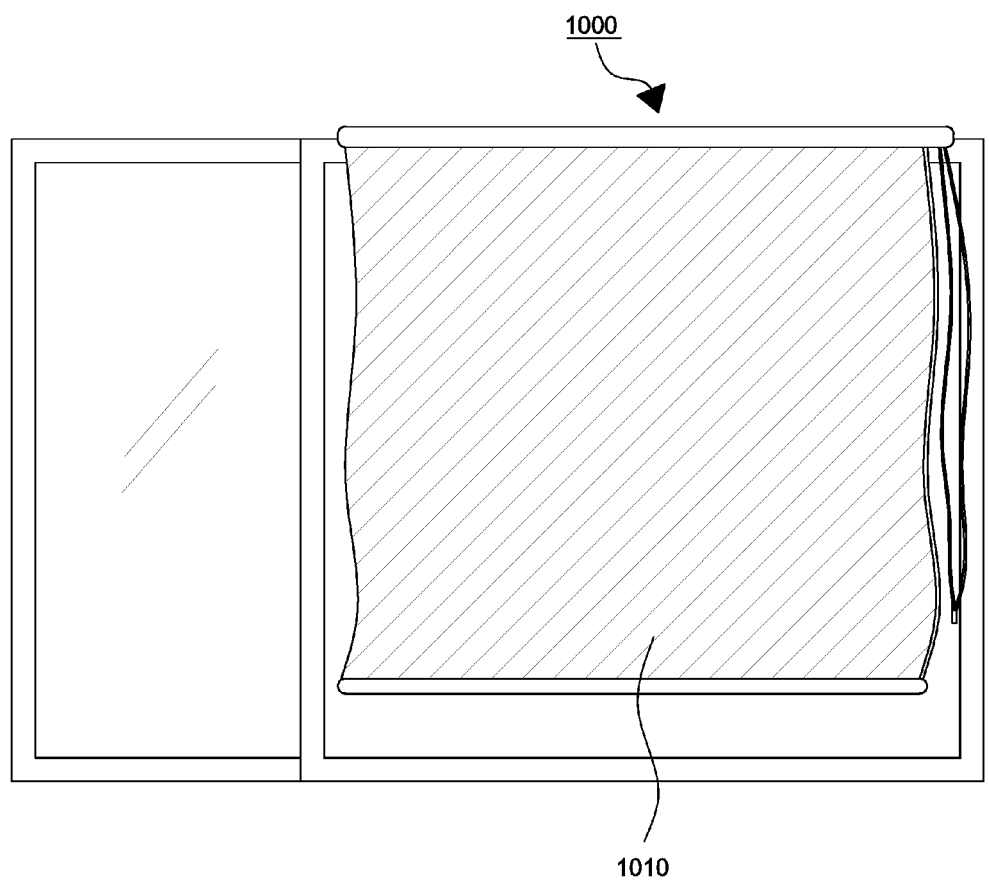
FIG. 10 is an exemplary diagram illustrating a curtain including a transformable device according to an embodiment of the present disclosure.

FIG. 10 is an exemplary diagram illustrating a curtain including the transformable device according to an embodiment of the present disclosure. Referring to FIG. 10, a curtain 1000 includes a display panel 1010 and a transformable device joined to the lower portion of the display panel 1010.

In the curtain 1000 including the transformable device according to an embodiment of the present disclosure, information about external environment may be expressed in various manners by the transformable device. Specifically, external weather may be displayed on a predetermined screen through the display panel 1010, and the form of the curtain 1000 may be changed to express a state of a specific weather. For example, in case of cloudy and windy weather, a cloud may be displayed through the display panel 1010 of the curtain 1000, a part of the curtain 1000 may be bent, and an area of the bent part may be varied, according to a direction of wind and a speed of wind by the transformable device. In other words, a direction in which an actual curtain is bent or shaken according to the direction of wind may be expressed by the bending direction of the curtain 1000, and an area of the bent part of the curtain 1000 may be increased as the wind gets stronger. Further, when an intensity of light input through a glass window is lower than a predetermined intensity, the curtain 1000 may be automatically rolled up or may be folded left or right.

The embodiments of the present disclosure have been described in more detail with reference to the accompanying drawings, but the present disclosure is not necessarily limited to such embodiments, and may be variously modified within the scope which does not deviate from the technical spirit of the present disclosure. Therefore, the embodiments described in the present disclosure are not to restrict the technical spirit of the present disclosure but are to explain it, and the scope of the technical spirit of the present disclosure is not restricted by such embodiments. The protection range of the present disclosure should be understood by the following Claims, and it should be understood that all the technical spirits within the scope equivalent thereto are included in the right scope of the present disclosure.

What is claimed is:

1. A transformable device, comprising:
   an electro-active layer;
   a first electrode inside the electro-active layer; and
   a second electrode inside the electro-active layer, the second electrode being spaced apart from the first electrode,
   wherein at least one of the first electrode and the second electrode includes precipitates of a conductive material.

2. A transformable device according to claim 1, wherein all sides of the first electrode and the second electrode are surrounded by the electro-active layer.

3. A transformable device according to claim 1, wherein the electroactive layer includes impurities, the impurities including at least one of a conductive material, a precipitant, a compound of a conductive material and a precipitant, and a hardener.

4. A transformable device according to claim 3, wherein a concentration of the impurities in the electro-active layer increases closer to the first electrode and the second electrode.

5. A transformable device according to claim 3, wherein the first electrode and the second electrode are disposed within a range along a thickness direction Td of the electro-active layer in which the concentration of the impurities in the electro-active layer is higher than a specific concentration N0.

6. A transformable device according to claim 1, wherein a thickness (d) of the electro-active layer is 50 µm to 400 µm.

7. A transformable device according to claim 1, wherein the first electrode is positioned at a distance (d1) from a lower surface of the electro-active layer and the second electrode is positioned at a distance (d2) from an upper surface of the electro-active layer, wherein the distance (d1) is the distance between a lower surface of the first electrode and a the lower surface of the electroactive layer and the distance (d2) is the distance between an upper surface of the second electrode and an upper surface of electro-active layer.

8. A transformable device according to claim 1, wherein a thickness (d1) between a lower surface of the first electrode and a lower surface of the electroactive layer and a thickness (d2) between an upper surface of the second electrode and an upper surface of electro-active layer are smaller than a third thickness (d3) of the electro-active layer between the first electrode and the second electrode.

9. A transformable device according to claim 8,
   wherein a part of the electro-active layer between the lower surface of the first electrode and the lower surface of the electro-active layer and a part of between the upper surface of the second electrode and the upper surface of electro-active layer are shielding layers.

10. A transformable device according to claim 8, wherein the first electrode is disposed at a lower portion of the electro-active layer and the second electrode is disposed close to a center of the electro-active layer, and
    wherein a fourth thickness (d4) of the electro-active layer between the first electrode and the second electrode is smaller than the third thickness (d3) of the electro-active layer.

11. A transformable device according to claim 1, wherein the electro-active layer includes an electro-active polymer.

12. A transformable device according to claim 11, wherein the electro-active layer includes an elastomer.

13. A transformable device according to claim 7, wherein at least one of the distance (d1) and the distance (d2) is from 0.1 µm to 10 µm.

14. A transformable device comprising:
    an electro-active layer;
    a first electrode inside the electro-active layer; and
    a second electrode inside the electro-active layer, the second electrode being spaced apart from the first electrode,
    wherein the electroactive layer includes impurities, the impurities including at least one of a conductive material, a precipitant, a compound of a conductive material and a precipitant, and a hardener, and
    wherein a concentration of the impurities in the electro-active layer increases closer to the first electrode and the second electrode.

15. A transformable device comprising:
    an electro-active layer;
    a first electrode inside the electro-active layer; and
    a second electrode inside the electro-active layer, the second electrode being spaced apart from the first electrode,
    wherein the electroactive layer includes impurities, the impurities including at least one of a conductive material, a precipitant, a compound of a conductive material and a precipitant, and a hardener, and
    wherein the first electrode and the second electrode are disposed within a range along a thickness direction Td of the electro-active layer in which the concentration of the impurities in the electro-active layer is higher than a specific concentration N0.

\* \* \* \* \*